United States Patent
Lye et al.

(10) Patent No.: US 11,301,065 B2
(45) Date of Patent: Apr. 12, 2022

(54) NAVIGATION SYSTEM, NAVIGATION DEVICE AND FRAME RATE ADJUSTING METHOD THEREOF

(71) Applicant: PIXART IMAGING INC., Hsin-Chu County (TW)

(72) Inventors: Keng-Yeen Lye, Penang (MY); Kevin Len-Li Lim, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 132 days.

(21) Appl. No.: 16/804,514

(22) Filed: Feb. 28, 2020

(65) Prior Publication Data
US 2021/0271334 A1    Sep. 2, 2021

(51) Int. Cl.
*G06F 3/038* (2013.01)
*G06F 3/0354* (2013.01)
*G01C 21/20* (2006.01)
*G06F 1/04* (2006.01)
*H03K 21/08* (2006.01)

(52) U.S. Cl.
CPC .......... *G06F 3/0383* (2013.01); *G01C 21/20* (2013.01); *G06F 1/04* (2013.01); *G06F 3/03543* (2013.01); *H03K 21/08* (2013.01)

(58) Field of Classification Search
CPC .. G06F 3/0383; G06F 1/3259; G06F 3/03543; G06F 3/038; G06F 1/04; G01C 21/20; H03K 21/08
See application file for complete search history.

(56) References Cited

U.S. PATENT DOCUMENTS

| | | | | |
|---|---|---|---|---|
| 5,913,076 A  * | 6/1999 | Yamada | ............... | G06F 3/05 710/69 |
| 2005/0188236 A1* | 8/2005 | Griffin | ............... | G06F 1/3237 713/500 |
| 2008/0278445 A1* | 11/2008 | Sweetser | ............... | G06F 3/0325 345/158 |
| 2014/0300548 A1* | 10/2014 | Lye | ............... | G06F 1/3259 345/163 |

* cited by examiner

*Primary Examiner* — Abbas I Abdulselam
(74) *Attorney, Agent, or Firm* — Hauptman Ham, LLP

(57) ABSTRACT

There is provided a frame rate adjusting method of a navigation device including: counting a frame period using a clock of a local oscillator of the navigation device; counting a polling period using the same clock; calculating a difference between the frame period and the polling period; adjusting a frame rate of the navigation device when the difference is smaller than a predetermined margin.

19 Claims, 3 Drawing Sheets

NAVIGATION SYSTEM, NAVIGATION DEVICE AND FRAME RATE ADJUSTING METHOD THEREOF

BACKGROUND

1. Field of the Disclosure

This disclosure generally relates to a navigation device and system and, more particularly, to a navigation device and system having an adjustable frame rate to reduce the power consumption by operating at a minimum operable frame rate and a frame rate adjusting method thereof.

2. Description of the Related Art

In a typical image based mouse device, the motion of the mouse device is produced by calculating displacement between a pair of images captured by an image sensor thereof at a frame rate. Then, a microcontroller unit will read the calculated displacement from the image sensor at a polling frequency to perform corresponding control. To read non-zero displacement data from the image sensor when the mouse device is continuously in motion, the frame rate should be kept being larger than the polling frequency all the time.

Typically, a mouse device includes an interval oscillator which is generally not an accurate oscillator, e.g., a crystal oscillator, in order to reduce the cost. Due to the natural variation on the internal oscillator's frequency over process, voltage, and temperature (PVT), the frame rate is configured to include a margin above the polling frequency to keep the displacement data being read correctly. Since the power consumption of an image sensor is strongly related to the frame rate, the margin should be kept as small as possible to allow the image sensor to operate at the minimum operable frame rate.

Accordingly, the present disclosure provides a navigation device and system having an adjustable frame rate to reduce the power consumption thereof by operating at a minimum operable frame rate as well as a frame rate adjusting method thereof.

SUMMARY

The present disclosure provides a navigation device and system that determine a frame period and count a polling period by a clock of an internal oscillator thereof, and adjust the frame period according to a difference between the determined frame period and the counted polling period.

The present disclosure provides a navigation device including an internal oscillator and a processor. The internal oscillator is configured to generate a clock signal having a clock frequency. The processor is coupled to the internal oscillator, and configured to count the clock signal between successive displacement being readout to determine a polling period, generate displacement every frame period, and compare the polling period and the frame period to determine whether to adjust the frame period.

The present disclosure further provides a navigation system including a computer system and a navigation device. The computer system is configured to send requests to read displacement. The navigation device is coupled to the computer system, and includes an I/O interface, an internal oscillator and a processor. The I/O interface is configured to receive the requests from the computer system and output the displacement to the computer system. The internal oscillator is configured to generate a clock signal having a clock frequency. The processor is coupled to the I/O interface and the internal oscillator, and configured to count the clock signal between successive displacement being readout to determine a polling period, generate the displacement every frame period, calculate a difference between the polling period and the frame period, and compare the difference with a predetermined margin.

The present disclosure further provides a frame rate adjusting method of a navigation device including: counting, by a processor, a frame period using a clock signal of an internal oscillator; counting, by the processor, a polling period using the clock signal of the internal oscillator to output displacement every polling period; calculating, by the processor, a difference between the frame period and the polling period; and adjusting, by the processor, the frame period when the difference is smaller than a predetermined margin.

In the embodiment of the present disclosure, the navigation device is an image based navigation device such as an optical mouse, a finger navigator, a cleaning robot or the like that has a navigation sensor for calculating displacement with respect to a work surface, and the calculated displacement is then readout at a polling rate by a processor outside the navigation sensor.

In the embodiment of the present disclosure, the frame rate is increased or decreased by directly changing the clock frequency of a local oscillator or by changing a count threshold that determines one image frame to be generated.

In the embodiment of the present disclosure, a margin, e.g., M, between the frame rate and the polling rate is preferably $0.1\% < M < 4.12\%$ of the polling rate. By keeping the frame rate to be larger than the polling rate above (or equal to) the margin, the external MCU does not read zero-displacement as long as the navigation device is continuously in motion, wherein said in motion is referred to, for example, that the displacement calculated by adjacent two image frames is larger than a predetermined value (promising that the calculated displacement is not caused by noises).

In the embodiment of the present disclosure, the polling rate is counted every predetermined time interval without being counted continuously since the clock frequency of a local oscillator of the navigation device does not deviate quickly under room temperature. If the margin M is set smaller, the predetermined time interval between counting the polling rate is set larger.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The present disclosure is related to keeping the frame rate of an image sensor of a navigation device at a minimum operable value (still faster than polling rate) to reduce the power consumption of the unnecessary high frame rate. Furthermore, the adjustment process of the frame rate is performed occasionally to further reduce the power consumption caused thereby due to the nature of slow frequency drift of the clock signal at room temperature.

Figure 1:
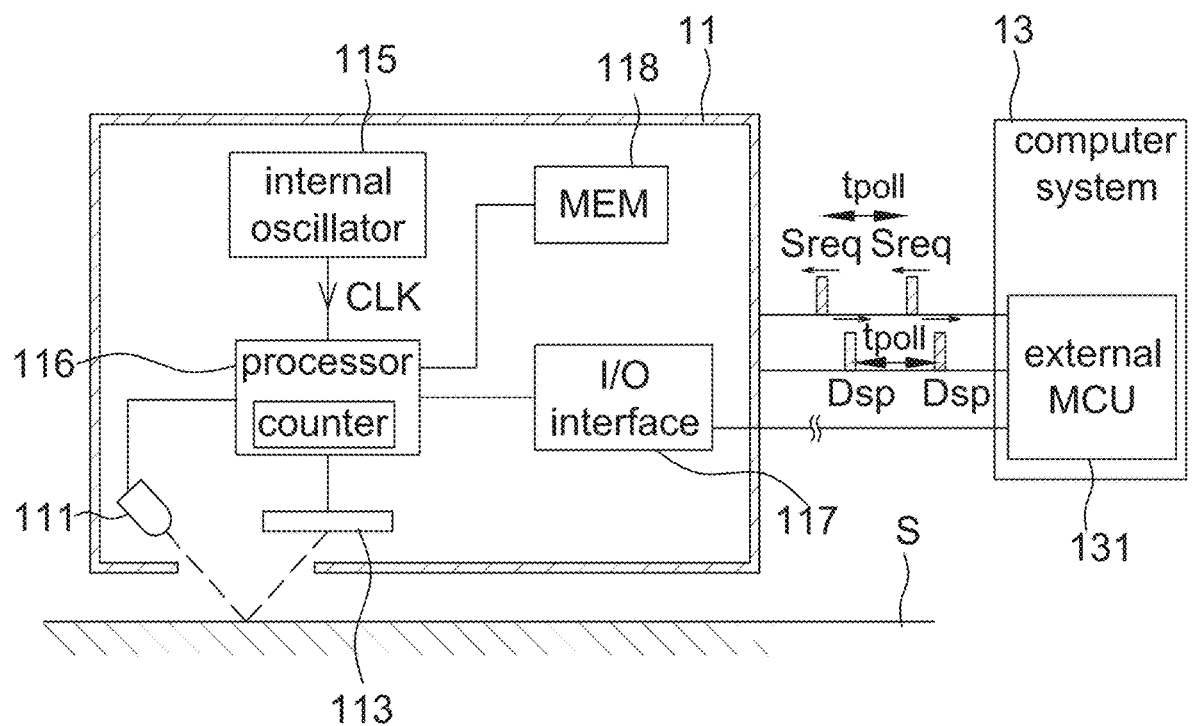
FIG. 1 is a schematic block diagram of a navigation system according to one embodiment of the present disclosure.

Referring to FIG. 1, it is a schematic block diagram of a navigation system 100 according to one embodiment of the present disclosure. The navigation system 100 includes a navigation device 11 and a computer system 13 coupled to each other in a wired or wireless manner. The computer system 13 frequently sends requests, shown as Sreq in FIG. 1 for illustration purposes, to read displacement from the navigation device 11 in order to perform corresponding control. The navigation device 11 outputs displacement, shown as Dsp in FIG. 1 for illustration purposes, in response to the requests Sreq from an external microcontroller unit (MCU) 131 included in the computer system 13.

The navigation device 11 is, for example, an optical mouse, an optical finger navigation or a cleaning robot operating with respect to a work surface S, which is a table surface, a finger surface or a floor surface corresponding to the type of the navigation device 11. At least one of the navigation device 11 and the work surface S is moved during operation.

The computer system 13 is, for example, a tablet computer, a desktop computer, a notebook computer, a work station, a smart home server or the like that performs the corresponding control using the displacement data received from the navigation device 11.

Figure 2:
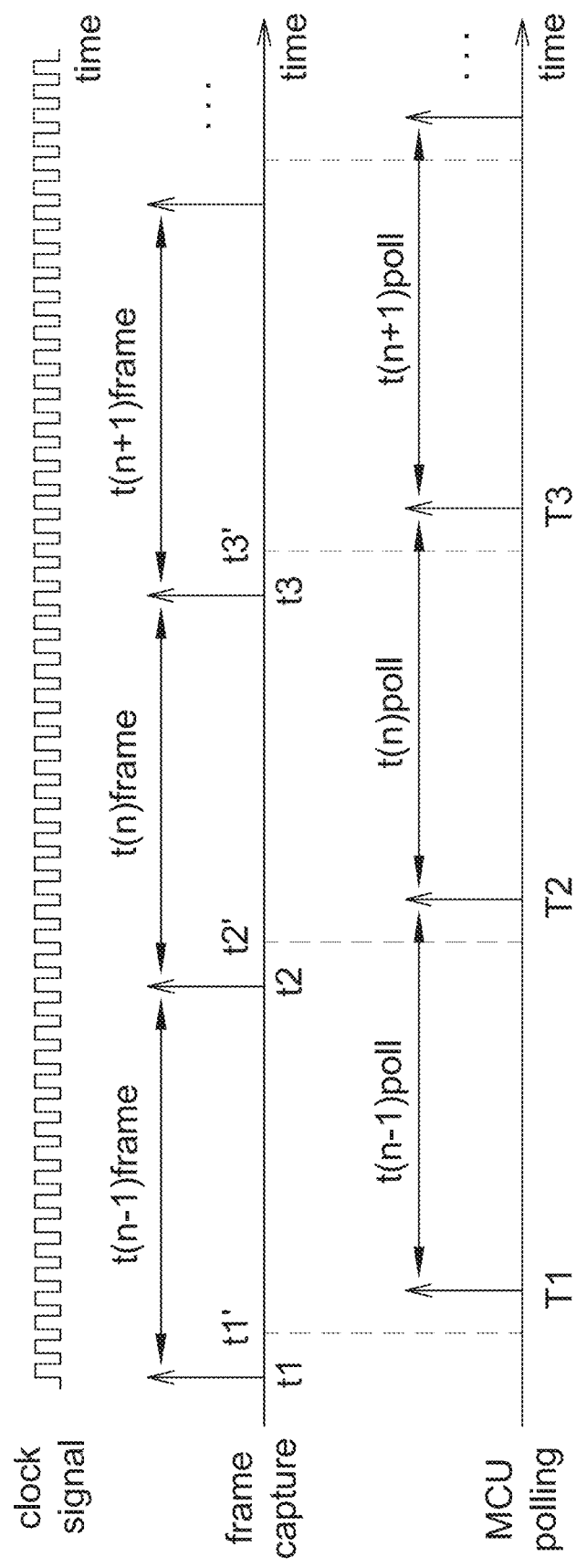
FIG. 2 is a schematic diagram of the operation of a navigation system according to one embodiment of the present disclosure.

Referring to FIGS. 1 and 2 together, FIG. 2 is a schematic diagram of the operation of the navigation system 100 according to one embodiment of the present disclosure. As shown in FIG. 2, the external MCU 131 reads displacement every polling period, e.g., shown as t(n−1)poll, t(n)poll and t(n+1)poll, and the navigation device 11 generates the displacement every frame period, e.g., shown as t(n−1)frame, t(n)frame and t(n+1)frame.

The navigation device 11 includes a light source 11, an image sensor 113, an internal oscillator 115, a processor 116, a I/O interface 117 and a memory 118, and some or all of these elements are formed as a sensor chip.

The light source 111 is an infrared light emitting diode or an infrared laser diode, and is used to illuminate the work surface S during operation. The lighting of the light source 111 is controlled by the processor 116 and corresponding to the frame capturing of the image sensor 113.

The image sensor 113 is a CCD image sensor, a CMOS image sensor or a single-photon avalanche diode (SPAD) sensor array. The image sensor 113 is used to receive reflected light from the work surface S to output image frames at a frame rate $f_{frame}$. The structure and operation of the CCD image sensor, the CMOS image sensor and the SPAD sensor array are known to the art and are not a main objective of the present disclosure, and thus details thereof are not described herein. As shown in FIG. 2, the image sensor 113 respectively captures an image frame at, for example, times t1, t2 and t3. A time interval between adjacent image frames is a frame period $t_{frame}$, e.g., showing as t(n−1)frame, t(n)frame and t(n+1)frame in FIG. 2. A frame rate $f_{frame}$ is a reciprocal of the frame period $t_{frame}$.

The internal oscillator 115 is used as a local oscillator of the navigation device 11, and generates pulses of a clock signal CLK at a clock frequency. To reduce the total cost, the internal oscillator 115 is not a crystal oscillator and may have a frequency shift from PVT. The internal oscillator 115 is, for example, an RC oscillator, but not limited to. If previously trimmed before shipment or setup, the internal oscillator 115 may have about +3% or −3% frequency shift over voltage and temperature. If not previously trimmed before shipment or setup, the internal oscillator 115 can even have +13% or −13% frequency shift over voltage and temperature.

In some non-limiting aspects, the I/O interface 117 is a wired interface, e.g., USB, or a wireless interface, e.g., a Bluetooth or WiFi. The I/O interface 117 is used to receive the request Sreq from the computer system 13 (or from the external MCU 131) and output the displacement Dsp to the computer system 13. As shown in FIG. 1, a time interval between adjacent requests Sreq and between adjacent outputted displacement Dsp is referred to a polling period $t_{poll}$ herein, e.g., showing as t(n−1)poll, t(n)poll and t(n+1)poll in FIG. 2. A polling rate $f_{poll}$ is a reciprocal of $t_{poll}$. The polling rate of the external MCU 131 is controlled by a system clock of the computer system 13, and said system clock is generally trimmed to only have +1% or −1% frequency shift over voltage and temperature.

The frequency shifts mentioned above may cause the frame rate $f_{frame}$ to be smaller than the polling rate $f_{poll}$ in the worst case.

In consideration of the frequency shifts of both the interval oscillator 115 and the system clock of the computer system 13, the following equation (1) is preferably fulfilled in order to operate correctly:

$$f_{frame} > (1+Y) \times f_{poll}/(1-X) \tag{1}$$

wherein, X is the interval oscillator variation in percentage, and Y is the MCU polling rate variation in percentage. In considering the above mentioned frequency shifts of the interval oscillator 115 and the system clock of the computer system 13, a difference $[f_{frame}-(1+Y)\times f_{poll}/(1-X)]$ is between 0.1% and 16% of $f_{poll}$ or preferably between 0.1% and 4% of $f_{poll}$.

Figure 3:
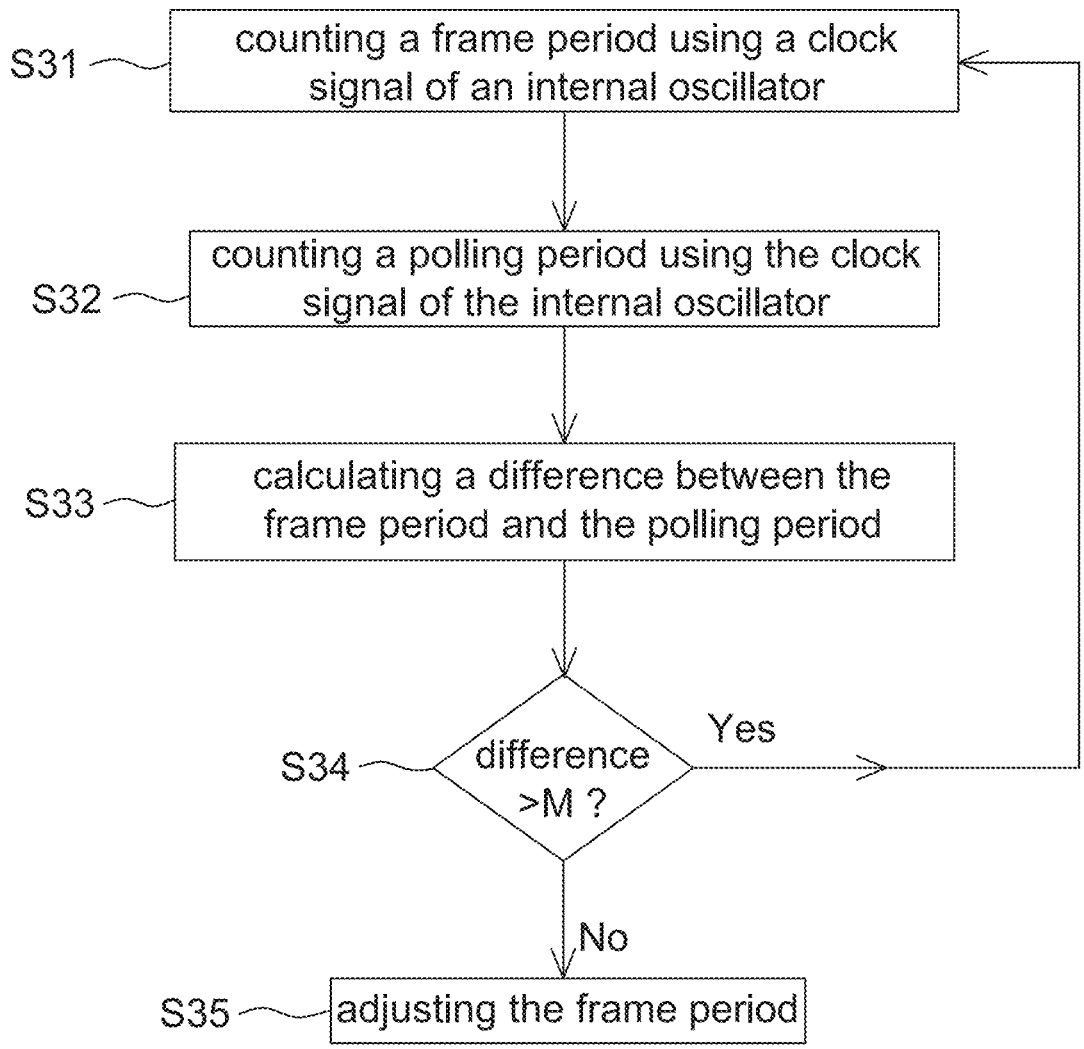
FIG. 3 is a flow chart of a frame rate adjusting method of a navigation device according to one embodiment of the present disclosure.

The memory 118 is a volatile memory, e.g., RAM, or nonvolatile memory, e.g., flash memory, which is used to store predetermined margins, parameters and algorithm that are used in operation, e.g., performing the method in FIG. 3.

The processor 116 is electrically coupled to the internal oscillator 15, the memory 118 and the I/O interface 117, and is selected from a digital signal processor (DPS) or an application specific integrated circuit (ASIC). The processor 116 is used to count a clock signal between successive displacement readout to determine a polling period $t_{poll}$, generate displacement every frame period $t_{frame}$, and compare the polling period $t_{poll}$ and the frame period $t_{frame}$ to determine whether to adjust the frame period $t_{frame}$. In the present disclosure, the displacement readout includes sending a request Sreq from the external MCU 131 to the navigation device 11 and outputting displacement Dsp from the navigation device 11 to the external MCU 131.

In comparing the polling period $t_{poll}$ and the frame period $t_{frame}$, the processor 116 firstly calculates a difference between the polling period $t_{poll}$ and the frame period $t_{frame}$ (e.g., $t_{poll}-t_{frame}$), and then compares the difference with a predetermined margin M. In the present disclosure, the predetermined margin M is set as 0.1% to 16% of the polling period $t_{poll}$ if the clock frequency of the internal oscillator 115 is not trimmed previously, and is set as 0.1% to 4% of the polling period $t_{poll}$ if the clock frequency of the internal oscillator 115 has been previously trimmed.

In the present disclosure, as the navigation device 11 does not know the system clock of the computer system 13, the processor 116 determines the polling period $t_{poll}$ using the clock signal CLK from the internal oscillator 115. In one non-limiting aspect, the processor 116 counts a number of pulses of the clock signal CLK between a pair of adjacent requests Sreq from the external MCU 131 of the computer system 13 to determine the polling period $t_{poll}$. In another non-limiting aspect, the processor 116 counts a number of pulses of the clock signal CLK between a pair of displacement Dsp adjacently outputted to the external MCU 131 of the computer system 13 to determine the polling period $t_{poll}$.

In the present disclosure, the processor 116 counts a number of pulses of the clock signal up to a predetermined number, and when the predetermined number is reached, an image frame is generated, e.g., at times t1', t2' and t3' in FIG. 2. That is, in the present disclosure the frame period $t_{frame}$ is a time interval during which a predetermined number of pulses of the clock signal CLK is counted. Accordingly, there are two ways to adjust frame period $t_{frame}$, i.e. adjusting the frame rate. The first way is to directly increase or decrease the clock frequency such that when the predetermined number of pulses of the clock signal CLK is reached, the frame period $t_{frame}$ is also increased or decreased. The second way is to increase or decrease the predetermined number such that when a different predetermined number of pulses of the clock signal CLK is reached, the frame period $t_{frame}$ is also increased or decreased.

Referring to FIG. 3, it is a flow chart of a frame rate adjusting method of a navigation device 11 according to one embodiment of the present disclosure, including the steps of: counting, by a processor, a frame period using a clock signal of an internal oscillator (Step S31); counting, by the processor, a polling period using the clock signal of the internal oscillator to output displacement every polling period (Step S32); calculating, by the processor, a difference between the frame period and the polling period (Step S33); and adjusting, by the processor, the frame period when the difference is smaller than a predetermined margin (Step S34-S35). Referring to FIGS. 1 to 3, details of one example of the frame rate adjusting method are described below.

Step S31: The processor 116 counts a number of pulses of the clock signal CLK up to a predetermined value as a frame period $t_{frame}$. For example, if a clock cycle of the clock signal CLK is $T_{CLK}$ and a number of counted pulses is Nf, then $t_{frame}=T_{CLK} \times Nf$. For example in FIG. 2, the processor 116 receives an image frame from the image sensor 113 at times t1, t2 and t3, and then calculates and generates displacement respectively at times t1', t2' and t3'. That is, during the time interval (t1'-t1), (t2'-t2) and (t3'-t3), the processor 116 calculates the displacement by comparing two image frames received from the image sensor 113. The method to calculate the displacement may use conventional method, e.g., correlation between image frames, without particular limitations.

Step S32: The external MCU 131 of an external computer system 13 frequently sends requests Sreq to the navigation device 11 to read displacement for corresponding control, e.g., controlling a cursor shown on a display screen or changing the moving direction. The processor 116 of the navigation device 11 counts a number of pulses of the clock signal CLK between a pair of adjacent requests Sreq to determine a polling period $t_{poll}$. For example, if a clock cycle of the clock signal CLK is $T_{CLK}$ and a number of counted pulses is Np, then $t_{poll}=T_{CLK} \times Np$.

Step S33: After obtaining the frame period $t_{frame}$ and the polling period $t_{poll}$, the processor 116 calculates a difference between the frame period $t_{frame}$ and the polling period $t_{poll}$, wherein said difference is $(t_{poll}-t_{frame})$ or (Np-Nf).

Step S34: Next, the processor 116 compares the difference with a predetermined margin M, wherein the predetermined margin M is a time interval or a number of pulses depending on which of $(t_{poll}-t_{frame})$ or (Np-Nf) is used. In the present disclosure, M is selected from 0.1% to 16% of $t_{poll}$ or Np. If the difference is larger than the predetermined margin M, it means that the frequency drift of clock signal CLK is not apparent enough and thus it is not necessary to perform the frame period or frame rate adjustment, and thus Step S31 is returned.

Step S35: When the difference is smaller than the predetermined margin M, the processor 116 adjusts the frame period $t_{frame}$. As mentioned above, the frame period $t_{frame}$ is adjusted by directly increasing or decreasing a clock frequency of the internal oscillator 115, or by increasing or decreasing a predetermined number of pulses of the clock signal CLK to generate one image frame. For example, if the processor 116 originally generates one image frame every N counted clock pulses, after the adjustment the processor 116 generates one image frame every (N+1) or (N−1) counted clock pulses, but not limited thereto. As long as the polling period $t_{poll}$ is kept being longer than the frame period $t_{poll}$, zero-displacement is not readout to the external MCU 131 when the navigation device 11 continuously has a relative movement with respect to the work surface S.

As mentioned above, since the frequency drift of the internal oscillator 115 is slow under room temperature, it is not necessary to perform the process of FIG. 3 at each displacement readout. In one non-limiting aspect, the processor 116 counts the clock signal CLK between successive displacement readout every predetermined time interval, which is much longer than a time interval between two displacement readout, e.g., 100 msec or more when the polling period is 1 msec. The predetermined time interval is set before shipment or selected by a user via a user interface to cover more numbers of displacement readout when the predetermined margin M is set smaller. For example, the processor 116 counts one polling period $t_{poll}$ using the clock signal CLK between a pair of displacement readout, and then stop counting another polling period $t_{poll}$ using the clock signal CLK for a predetermined number of displacement readout after the pair of displacement readout.

It is appreciated that although the above embodiment is described in the way that the processor 116 calculates a period difference to be compared with a period margin M, the present disclosure is not limited to. It is possible that the processor 116 calculates a rate difference (i.e., $f_{frame}-f_{poll}$) to be compared with a rate margin since the frame rate and the polling rate are respectively reciprocals of the frame period and the polling period.

As mentioned above, in an image based mouse device, the frame rate should be always maintained to be faster than the displacement polling rate of an external MCU. However, if the frame rate is much higher than the displacement polling rate, it will cause unnecessary power consumption. Accordingly, the present disclosure further provides a navigation system and device (e.g. FIG. 1) and a frame rate adjusting method thereof (e.g. FIG. 3) that can keep the frame rate at a minimum operable value to improve the polling accuracy and reduce the total power consumption.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A navigation device, comprising:
an internal oscillator configured to generate a clock signal having a clock frequency; and
a processor coupled to the internal oscillator, and configured to
count the clock signal between successive displacement being readout to determine a polling period,
generate displacement every frame period,
compare the polling period and the frame period to determine whether to adjust the frame period, and
adjust the frame period upon a difference between the polling period and the frame period being smaller than a predetermined margin.

2. The navigation device as claimed in claim 1, wherein the processor is configured to count a number of pulses of the clock signal between a pair of adjacent requests from an external microcontroller unit (MCU) to determine the polling period.

3. The navigation device as claimed in claim 1, further comprising an I/O interface coupled to the processor, and configured to receive a request from an external MCU and output the displacement in response to the request, wherein
the processor is configured to count a number of pulses of the clock signal between a pair of displacement adjacently outputted from the I/O interface to the external MCU to determine the polling period.

4. The navigation device as claimed in claim 1, wherein
the processor is configured to count the clock signal between the successive displacement being readout every predetermined time interval, and
the predetermined time interval covers more numbers of displacement being readout when the predetermined margin is smaller.

5. The navigation device as claimed in claim 1, wherein the processor is configured to adjust the frame period by increasing or decreasing the clock frequency.

6. The navigation device as claimed in claim 1, wherein the processor is configured to
count a number of pulses of the clock signal up to a predetermined number as the frame period, and
adjust the frame period by increasing or decreasing the predetermined number.

7. The navigation device as claimed in claim 1, wherein the processor is configured to
count one polling period using the clock signal between a pair of displacement being readout, and
then stop counting another polling period using the clock signal for a predetermined number of displacement being readout.

8. A navigation system, comprising:
a computer system configured to send requests to read displacement; and
a navigation device, coupled to the computer system, and comprising:
an I/O interface configured to receive the requests from the computer system and output the displacement to the computer system;
an internal oscillator configured to generate a clock signal having a clock frequency; and
a processor coupled to the I/O interface and the internal oscillator, and configured to
count the clock signal between successive displacement being readout to determine a polling period,
generate the displacement every frame period,
calculate a difference between the polling period and the frame period, and
compare the difference with a predetermined margin.

9. The navigation system as claimed in claim 8, wherein the processor is configured to count a number of pulses of the clock signal between a pair of adjacent requests received from the computer system to determine the polling period.

10. The navigation system as claimed in claim 8, wherein the processor is configured to count a number of pulses of the clock signal between a pair of displacement adjacently outputted from the I/O interface to the computer system to determine the polling period.

11. The navigation system as claimed in claim 8, wherein the processor is configured to adjust the frame period when the difference is smaller than a predetermined margin.

12. The navigation system as claimed in claim 11, wherein the processor is configured to adjust the frame period by increasing or decreasing the clock frequency.

13. The navigation system as claimed in claim 11, wherein the processor is configured to
count a number of pulses of the clock signal up to a predetermined number as the frame period, and
adjust the frame period by increasing or decreasing the predetermined number.

14. The navigation system as claimed in claim 11, wherein
the processor is configured to count the clock signal between the successive displacement being readout every predetermined time interval, and
the predetermined time interval covers more numbers of displacement being readout when the predetermined margin is smaller.

15. The navigation system as claimed in claim 8, wherein the processor is configured to
count one polling period using the clock signal between a pair of displacement being readout, and
then stop counting another polling period using the clock signal for a predetermined number of displacement being readout.

16. A frame rate adjusting method of a navigation device, the navigation device comprising an internal oscillator and a processor, the method comprising:
counting, by the processor, a frame period using a clock signal of the internal oscillator;
counting, by the processor, a polling period using the clock signal of the internal oscillator to output displacement every polling period;
calculating, by the processor, a difference between the frame period and the polling period; and
adjusting, by the processor, the frame period when the difference is smaller than a predetermined margin.

17. The frame rate adjusting method as claimed in claim 16, wherein the predetermined margin is from 0.1% to 16%.

18. The frame rate adjusting method as claimed in claim 16, wherein the polling period is a number of pulses of the clock signal being counted between adjacent two requests from an external MCU or between adjacent two outputted displacement.

19. The frame rate adjusting method as claimed in claim 16, wherein the frame period is adjusted
by increasing or decreasing a clock frequency of the internal oscillator, or
by increasing or decreasing a predetermined number of pulses of the clock signal to generate one image frame.

* * * * *